US010985592B2

(12) United States Patent
Li et al.

(10) Patent No.: US 10,985,592 B2
(45) Date of Patent: Apr. 20, 2021

(54) DYNAMIC REGULATION OF WIRELESS CHARGING SYSTEM

(71) Applicant: NXP B.V., Eindhoven (NL)

(72) Inventors: Xuechu Li, Shanghai (CN); Tinghua Yun, Changzhou (CN); Fuchun Zhan, Shanghai (CN)

(73) Assignee: NXP B.V., Eindhoven (NL)

( * ) Notice: Subject to any disclaimer, the term of this patent is extended or adjusted under 35 U.S.C. 154(b) by 131 days.

(21) Appl. No.: 16/237,732

(22) Filed: Jan. 1, 2019

(65) Prior Publication Data

US 2020/0177012 A1 Jun. 4, 2020

(30) Foreign Application Priority Data

Dec. 4, 2018 (CN) .......................... 201811468857.0

(51) Int. Cl.
*H02J 7/02* (2016.01)
*H02J 50/10* (2016.01)
*H02J 50/80* (2016.01)
*G01R 19/165* (2006.01)
*G05F 3/26* (2006.01)
*H02H 3/20* (2006.01)
*H03K 5/24* (2006.01)

(52) U.S. Cl.
CPC ........ *H02J 7/025* (2013.01); *G01R 19/16528* (2013.01); *G05F 3/262* (2013.01); *H02H 3/207* (2013.01); *H02J 50/10* (2016.02); *H02J 50/80* (2016.02); *H03K 5/2472* (2013.01)

(58) Field of Classification Search
CPC .......... H02J 50/10; H02J 50/80; H02J 50/001; H02J 50/005; H02J 50/12; H02J 50/30; H02J 50/40; H02J 50/402; H02J 50/50; H02J 50/502; H02J 50/60; H02J 50/70; H02J 50/90; H02J 7/00; H02J 7/0042; H02J 7/0044; H02J 7/0045; G01R 19/16528; G05F 3/262; H02H 3/207; H03K 5/2472
USPC ......................................................... 320/108
See application file for complete search history.

(56) References Cited

U.S. PATENT DOCUMENTS

| | | | | |
|---|---|---|---|---|
| 6,756,838 B1 * | 6/2004 | Wu | .......................... | G11C 5/14 |
| | | | | 327/536 |
| 8,611,106 B2 * | 12/2013 | Fang | ................. | H02M 3/33523 |
| | | | | 363/21.01 |
| 8,670,219 B2 | 3/2014 | Disney | | |
| 9,154,039 B2 * | 10/2015 | Li | ..................... | H02M 3/33523 |
| 9,184,667 B2 * | 11/2015 | Shi | ..................... | H02M 3/33523 |
| 10,034,336 B1 * | 7/2018 | Ye | .......................... | H05B 45/10 |
| 10,418,860 B2 * | 9/2019 | Lee | ......................... | H02J 7/025 |
| 2014/0362612 A1 * | 12/2014 | Shi | .................... | H02M 3/33523 |
| | | | | 363/21.16 |
| 2016/0268815 A1 * | 9/2016 | Lee | ......................... | H02J 7/025 |

(Continued)

*Primary Examiner* — M Baye Diao
(74) *Attorney, Agent, or Firm* — Lloyd E. Dakin, Jr.

(57) ABSTRACT

In a wireless charging system having a power transmitter (TX) and a power receiver (RX), the RX has a rectifier that rectifies an AC power signal received wirelessly from the TX into a rectified DC power signal. The RX also has regulation modules that monitor the DC power signal at various different voltage regions having one or more different high-voltage regions and one or more different low-voltage regions. Each regulation module affects operations of the wireless charging system in a different way. The regulation modules protect the RX from both over-voltage and under-voltage conditions.

12 Claims, 7 Drawing Sheets

(56) References Cited

U.S. PATENT DOCUMENTS

| | | | | |
|---|---|---|---|---|
| 2016/0359375 A1* | 12/2016 | Lee | .................. | H02J 50/40 |
| 2017/0012446 A1* | 1/2017 | Lim | .................. | H02J 3/007 |
| 2018/0205257 A1* | 7/2018 | Kwon | ................ | H05K 7/20 |
| 2018/0294681 A1* | 10/2018 | Bae | .................. | H02J 50/90 |

* cited by examiner

DYNAMIC REGULATION OF WIRELESS CHARGING SYSTEM

BACKGROUND

The present invention relates generally to wireless charging systems, and, more particularly, to a receiver of a wireless charging system that avoids over-voltage and under-voltage conditions.

Figure 1:
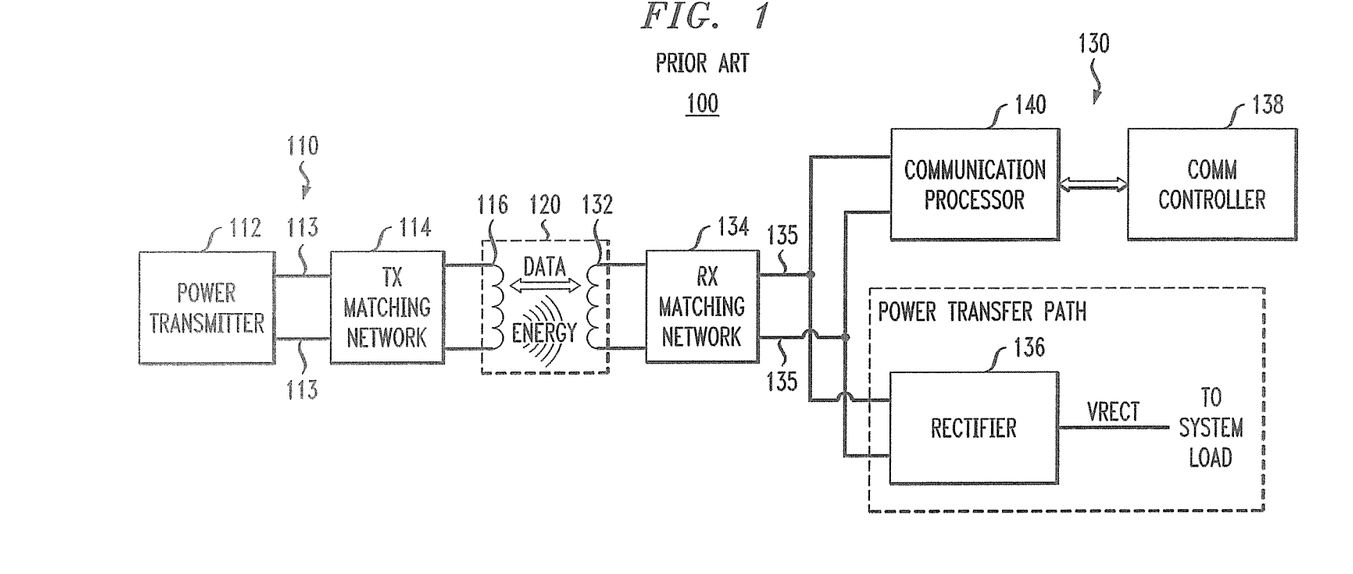
FIG. 1 is a simplified schematic block diagram of a conventional wireless power transfer system.

FIG. 1 is a simplified schematic block diagram of a conventional wireless charging system 100 having a power transmitter (TX) 110 and a power receiver (RX) 130. The TX 110 includes transmitter 112, TX matching network 114, and TX inductor coil 116, while the RX 130 includes RX inductor coil 132, RX matching network 134, rectifier (i.e., AC-to-DC converter) 136, communication controller 138, and communication processor 140. The matching networks 114 and 134 are designed to ensure that the output impedance of the TX 110 matches the input impedance of the RX 130. The TX and RX inductor coils 116 and 132 form an inductive interface 120 for wirelessly (i.e., magnetically) transferring (i) power from the TX 110 to the RX 130 and (ii) communications signals between the TX and RX 110 and 130.

The transmitter 112 applies an AC power signal 113 to the TX inductor coil 116 via the TX matching network 114. The AC power signal 113 induces an AC power signal in the RX inductor coil 132, which is applied via the RX matching network 134 as AC power signal 135 to the rectifier 136. The rectifier 136 rectifies the AC power signal 135 into a DC power signal VRECT that is applied to power the system load (not shown).

The communication controller 138 generates communication signals that are transmitted by the communication processor 140 through the inductive interface 120 to the TX 110. In particular, the communication controller 138 monitors VRECT and, if appropriate, transmits communication signals to (i) instruct the TX 110 to increase the power transfer level if VRECT is too low and (ii) instruct the TX 110 to decrease the power transfer level if VRECT is too high.

There are some situations, however, where the wireless charging system 100 will not operate properly. For example, under some conditions, the power transfer path can interfere with the communication path since they share a common inductive interface 120. In addition, under other conditions when VRECT is too high or too low, the conventional feedback signals back to the TX 110 may be too slow to prevent damage to either the load or even to the TX 110 and/or the RX 130 themselves. Accordingly, it would be advantageous to have a RX that can avoid over and under-voltage conditions.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a", "an", and "the", are intended to include the plural forms as well, unless the context clearly indicates otherwise. It further will be understood that the terms "comprises", "comprising", "has", "having", "includes", or "including" specify the presence of stated features, steps, or components, but do not preclude the presence or addition of one or more other features, steps, or components. It also should be noted that, in some alternative implementations, the functions/acts noted might occur out of the order noted in the figures. For example, two figures shown in succession may in fact be executed substantially concurrently or may sometimes be executed in the reverse order, depending upon the functionality/acts involved. The term "or" is to be interpreted as inclusive unless indicated otherwise.

In a wireless charging system, unless relatively light loading currents are properly regulated, the rectified DC voltage VRECT can be very high, which means devices in the power receiver (RX) must be able to withstand high voltage. On the other hand, when loading is heavy, unless properly regulated, VRECT could be too low to supply the wireless charging system, and the RF amplitude could also be too low for data communication.

According to embodiments of the present invention, in a wireless charging system having a power transmitter (TX) and a power receiver (RX), in addition to instructing the TX to adjust its transmitted power level in a system-level feedback loop, the RX has a plurality of regulation modules that locally monitor the rectified DC power signal VRECT for different over-voltage and under-voltage conditions and take appropriate actions to handle those situations, thereby extending the system's power transfer and data communication ranges in case the power transfer level is not well adjusted at the system level.

One embodiment of the invention is a power receiver (RX) for a wireless charging system. The RX comprises a rectifier configured to rectify an AC power signal received wirelessly from a TX into a DC power signal, and a plurality of regulation modules that monitor the DC power signal in a plurality of voltage regions comprising two or more different high-voltage regions and two or more different low-voltage regions, wherein each regulation module is configured to affect operations of the wireless charging system in a different way.

Figure 2:
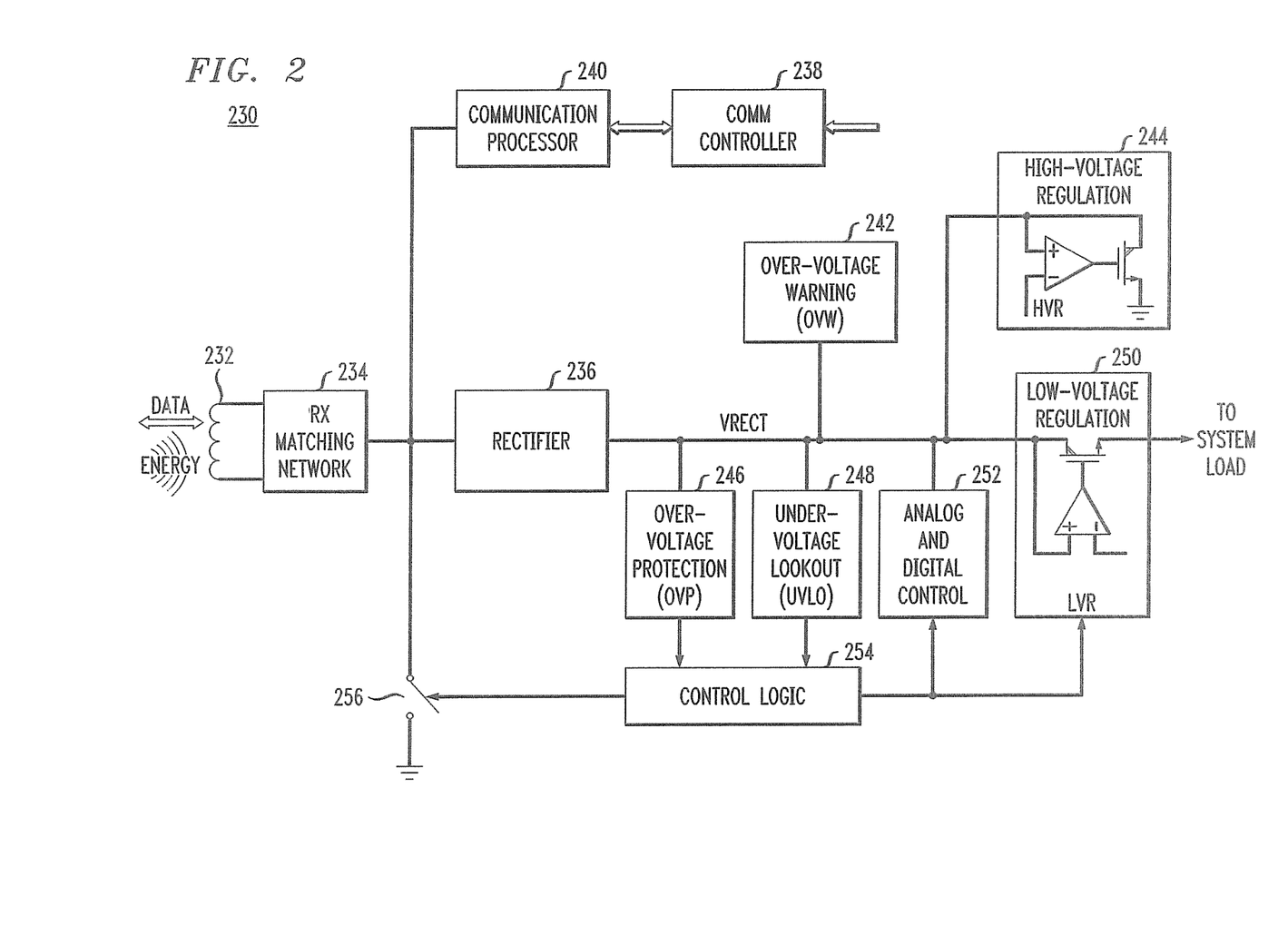
FIG. 2 is a block diagram of a power receiver (RX) in accordance with an embodiment of the present invention that can be used in a wireless charging system analogous to the wireless charging system of FIG. 1.

Referring now to FIG. 2, a block diagram of a RX 230 that can be used in a wireless charging system analogous to the wireless charging system 100 of FIG. 1 in place of the RX 130 is shown. Like the RX 130, the RX 230 includes RX inductor coil 232, RX matching network 234, rectifier 236, communication controller 238, and communication processor 240, each of which performs analogous functions as the corresponding elements in the RX 130.

The RX 230 also includes over-voltage warning (OVW) module 242, high-voltage regulation (HVR) module 244, over-voltage protection (OVP) module 246, under-voltage lookout (UVLO) module 248, low-voltage regulation (LVR) module 250, analog and digital control module 252, control logic 254, and switch 256. The OVW, HVR, OVP, UVLO, and LVR modules 242, 244, 246, 248, and 250 are referred to collectively as the regulation modules 242-250 because each of those modules monitors VRECT for different over-voltage and under-voltage conditions and, if appropriate, takes actions to handle specific conditions for which the module is designed. Note that a conventional RX, such as the RX 130 of FIG. 1 (although not explicitly shown in FIG. 1), will have modules that are analogous to the OVP and UVLO modules 246 and 248 of FIG. 2.

In typical wireless charging systems, the analog and digital control module 252 provides reference voltages and currents and internal supply voltages for the other functional modules in the RX 230. The control module 252 can also provide power up/down sequences and state machines for the operation of the system.

Depending on the particular implementation, the RX 230 can be used in a wireless charging system that operates as a battery charger, a low drop-out (LDO) regulator, a DC/DC converter, or any other suitable application.

Although the system-level feedback loop can eventually adjust the system in an optimized operation state, it is difficult for that feedback loop to track fast and dynamic changes of the loading. With loading changes and other possible operational condition changes, VRECT can move far away from its optimal level before the system-level feedback loop can take sufficient effect. In such situations, in accordance with the present invention, one or more of the HVR, OVP, UVLO, and LVR modules 244, 246, 248, and 250 will take local actions to change the behavior within the RX 230.

In particular, when the loading current is so light that VRECT becomes undesirably high, the HVR module 244 will become active and introduce a dummy load to inhibit VRECT from continuing to increase. If the dummy load is not large enough, and VRECT becomes dangerously high, then the OVP module 248 will be triggered to de-tune the RX inductor coil 232 and the RX matching network 234 to essentially stop the power rectification.

When the input power is too low for the whole loading current, the LVR module 250 will reduce the loading current so that the supply voltage can be maintained high enough to keep the RX 230 operating. With this protection, the wireless charging system can continue to operate even though there is only very little power being delivered to the output load. If the input power is too low to supply all the components in the RX 230, then the UVLO module 248 will be triggered to shut down some of them (e.g., the LVR module 250 and the analog and digital control module 252) to reduce the current dissipation of the power transfer path and reserve as much power as possible for the more-critical components (e.g., the communication controller 238 and the communication processor 240).

Figure 3:
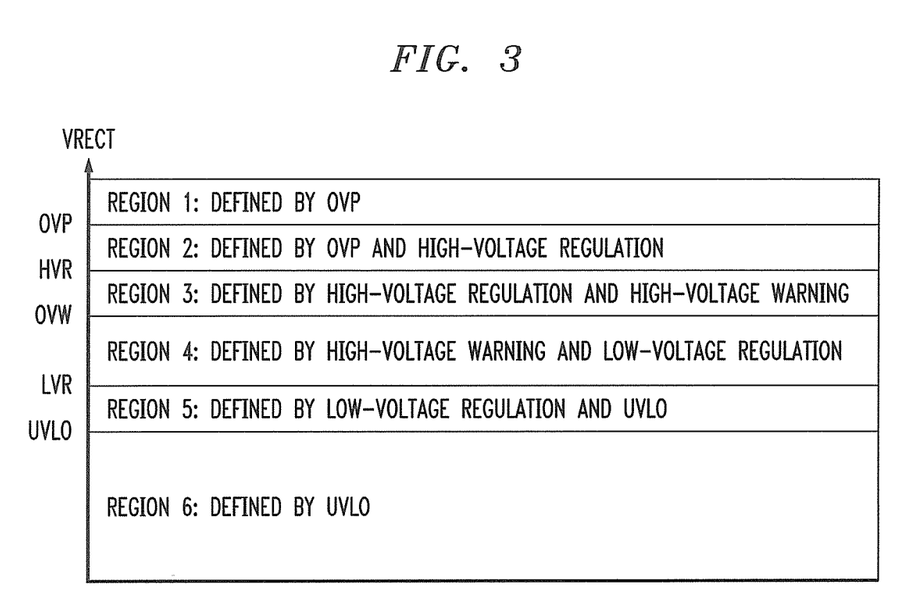
FIG. 3 shows five different voltage threshold levels that define six different voltage regions for the rectified DC voltage signal VRECT and the actions taken when VRECT falls within these different regions.

FIG. 3 shows five different voltage threshold levels that define the following six different voltage regions for VRECT and the corresponding actions that are taken when VRECT falls within those different regions:

Region 1: (OVP<VRECT)=>Shut down power rectification and instruct the TX to decrease the power transfer level.

Region 2: (HVR<VRECT<OVP)=>Inhibit increases in VRECT and instruct the TX to decrease the power transfer level.

Region 3: (OVW<VRECT<HVR)=>Instruct the TX to decrease the power transfer level.

Region 4: (LVR<VRECT<OVW)=>No action needed.

Region 5: (UVLO<VRECT<LVR)=>Reduce the loading current and instruct the TX to increase the power transfer level.

Region 6: (VRECT<UVLO)=>Shut down certain modules in the RX 230 and instruct the TX to increase the power transfer level.

Note that, if VRECT is above OVW, then some form of high-voltage regulation is needed. Similarly, if VRECT is below LVR, then some form of low-voltage regulation is needed. As described below, the regulation modules 242-250 monitor VRECT over at least six different voltage regions and take appropriate actions, as discussed below.

Figure 4:
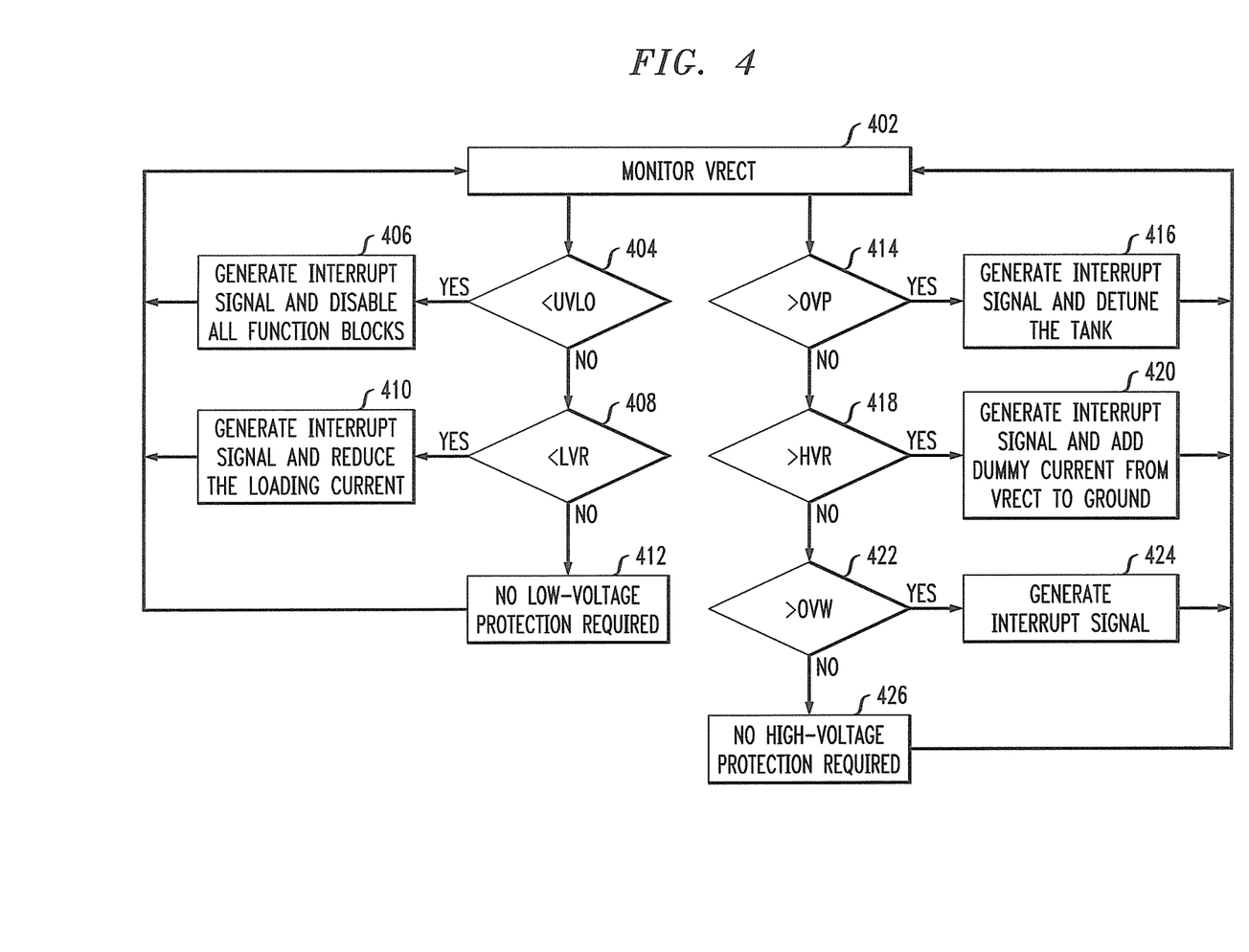
FIG. 4 is flow chart of a process implemented within the RX of FIG. 2 to monitor VRECT and handle different operating conditions.

FIG. 4 is flow chart of the various processing implemented within the RX 230 of FIG. 2 to monitor VRECT and handle different operating conditions. In step 402, VRECT is monitored by each of the regulation modules 242-250.

If the UVLO module 248 determines in step 404 that VRECT is below UVLO, then, in step 406, the UVLO module 248 signals the control logic 254 to shut down certain RX modules (e.g., the LVR module 250 and the analog and digital control module 252) in order to preserve power for more-critical operations (e.g., the communication controller 238 and the communication processor 240). In addition, the control logic 254 signals the communication controller 238 to instruct the TX to increase the power transfer level.

If VRECT is not below UVLO but is below LVR as determined at step 408, then, in step 410, the LVR module 250 will operate to reduce the loading current, as described further below in conjunction with FIG. 6. In addition, the LVR module 250 will signal the control logic 254 to signal the communication controller 238 to instruct the TX to increase the power transfer level.

If VRECT is not below LVR, then no low-voltage regulation is required as shown in step 412.

If the OVP module 246 determines in step 414 that VRECT is above OVP, then, in step 416, the OVP module 246 signals the control logic 254 to close switch 256 in order to detune the RX inductor coil 232 and the RX matching network 234, thereby shutting down the power rectification by the rectifier 236. In addition, the control logic 254 signals the communication controller 238 to instruct the TX to decrease the power transfer level.

If VRECT is not above OVP but is above HVR as determined at step 418, then, in step 420, the HVR module 244 will operate to inhibit increases in VRECT by introducing a dummy load, as described further below in conjunction with FIG. 7. In addition, the HVR module 244 will signal the control logic 254 to signal the communication controller 238 to instruct the TX to decrease the power transfer level.

If VRECT is not above HVR, but the OVW module 242 determines in step 422 that VRECT is above OVW, then, in step 424, the OVW module 242 will signal the control logic 254 to signal the communication controller 238 to instruct the TX to decrease the power transfer level.

If VRECT is not above OVW, then no high-voltage regulation is required as determined at step 426.

Note that the OVW module 242, the OVP module 246, and the UVLO module 248 can be implemented using (i) conventional comparator circuitry to compare VRECT with the corresponding threshold level and (ii) appropriate logic circuitry to perform the necessary signaling, as would be understood by those skilled in the art. Similarly, the analog and digital control module 252 and the control logic module 254 can be implemented with suitable digital and/or analog circuitry, as would be understood by those skilled in the art.

Figure 5:
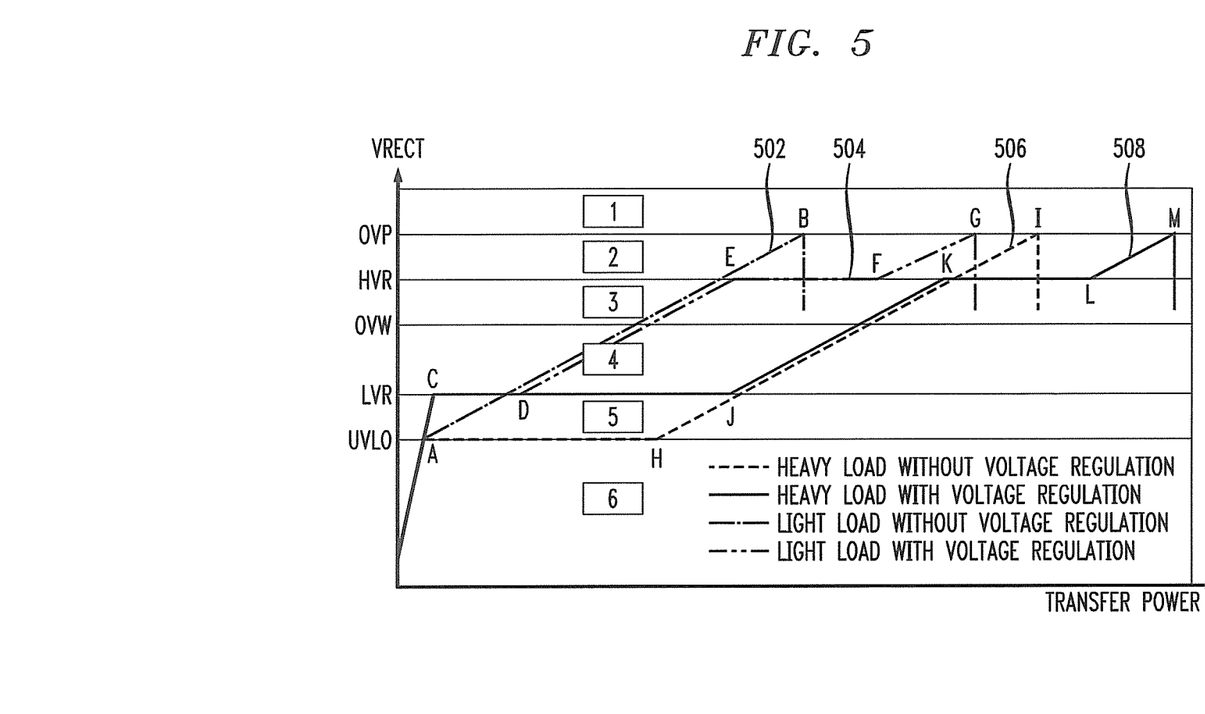
FIG. 5 is a diagram that represents the voltage level of VRECT as a function of different transfer power levels for two different loading levels, both with and without the voltage regulation processing of FIGS. 2 and 4.

FIG. 5 is a diagram that represents the voltage level of VRECT as a function of different transfer power levels for two different loading levels, both with and without the voltage regulation processing of FIGS. 2 and 4. In particular, the broken curve 502 represents a light-load situation without the voltage regulation processing of FIGS. 2 and 4 (but with the conventional regulation processing that is analogous to the regulation provided by the OVP and UVLO modules 246 and 248), while the solid curve 504 represents the same light-load situation, but with all of the voltage regulation processing of FIGS. 2 and 4. Similarly, the broken curve 506 represents a heavy-load situation without the voltage regulation processing of FIGS. 2 and 4 (but with the conventional regulation processing that is analogous to the regulation provided by the OVP and UVLO modules 246 and 248), while the solid curve 508 represents the same heavy-load situation, but with all of the voltage regulation processing of FIGS. 2 and 4.

When VRECT is in Region 4 between LVR and OVW, no regulation is needed, such that VRECT varies linearly with the transfer power level. As the transfer power level decreases (to the left in FIG. 5), eventually VRECT will fall below LVR, and the LVR module 250 will begin to reduce the loading current to try to keep VRECT at LVT in order to continue to power the RX 230. As the transfer power level continues to decrease, eventually VRECT will reach UVLO, and the UVLO module 248 will start to shut down certain components in order to keep more-critical components alive.

Referring again to VRECT in Region 4, as the transfer power level increases (to the right in FIG. 5), eventually VRECT will rise above HVR, and the HVR module 244 will begin to add dummy loading to inhibit VRECT from increasing. As the transfer power level continues to increase, eventually VRECT will reach OVP, and the OVP module 246 will close switch 256, de-tune the RX inductor coil 232 and the RX matching network 234, and terminate the power rectification processing of the rectifier 236.

In the conventionally regulated, light-load scenario of curve 502, as the transfer power level rises, VRECT remains unregulated between UVLO at Point A to OVP at Point B, after which the conventional version of the OVP module 246 causes VRECT to drop immediately.

In the corresponding, fully regulated, light-load scenario of curve 504, as the transfer power level decreases, VRECT is flat from Point D to Point C and then drops from Point C to the origin. As the transfer power level increases, VRECT is flat from Point E to Point F, rises from Point F to Point G, and then drops immediately after Point G.

In the conventionally regulated, heavy-load scenario of curve 506, VRECT stays at UVLO from Point A to Point H due to the conventional version of the UVLO module 248 and remains unregulated between UVLO at Point H and OVP at Point I, after which the conventional version of the OVP module 246 causes VRECT to drop immediately.

In the corresponding, regulated, heavy-load scenario of curve 508, as the transfer power level decreases, VRECT is flat from Point J to Point C and then drops from Point C to the origin. As the transfer power level increases, VRECT is flat from Point K to Point L, rises from Point L to Point M, and then drops immediately after Point M.

FIG. 5 illustrates how a wireless charging system having the voltage regulation processing of FIGS. 2 and 4 has an extended power transfer range compared to a wireless charging system that has only the conventional voltage regulation processing analogous to the OVP and UVLO modules 246 and 248.

Figure 6:
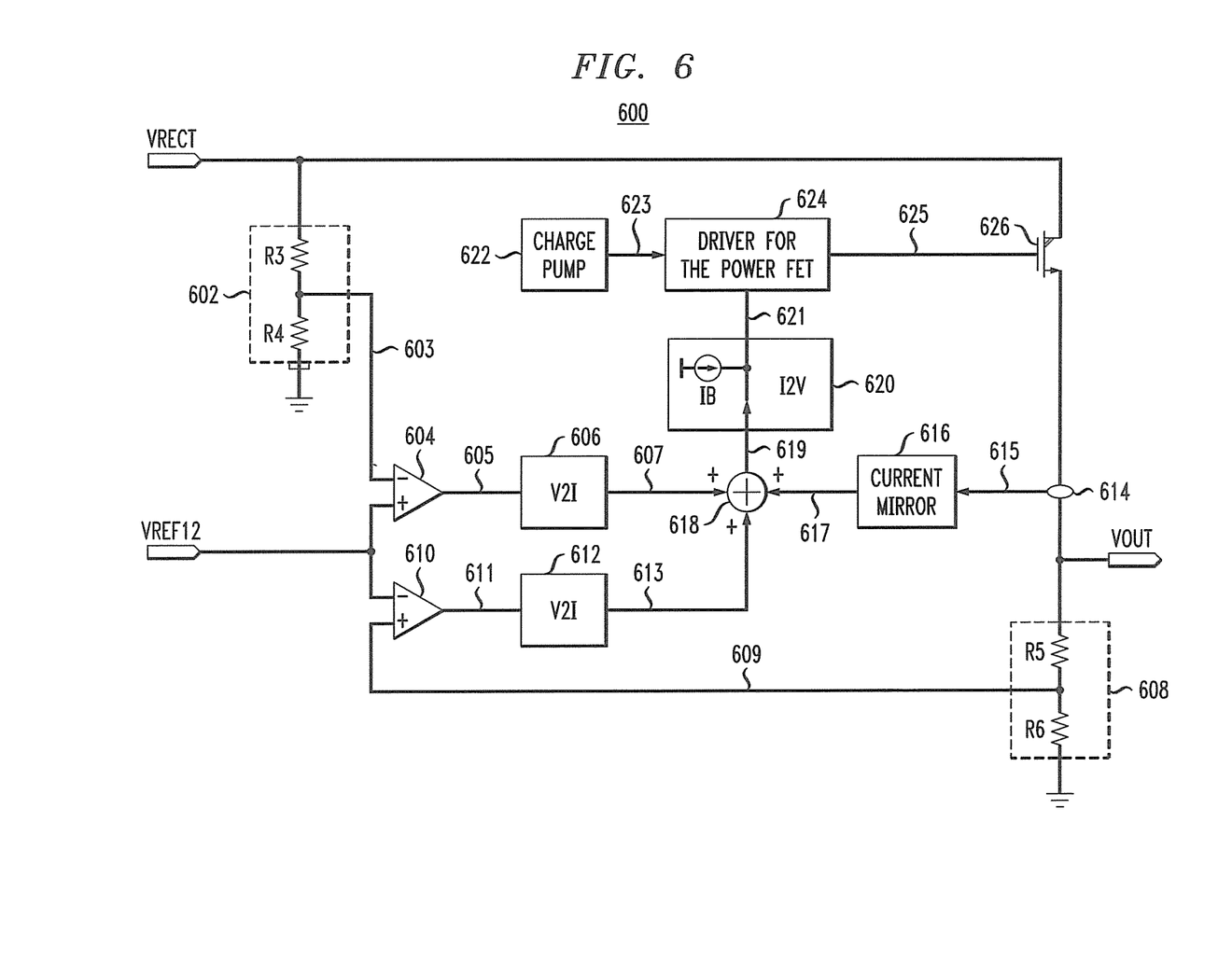
FIG. 6 is a schematic circuit diagram of a low-voltage regulation (LVR) module that can be used to implement the LVR module of FIG. 2.

FIG. 6 is a schematic circuit diagram of a low-voltage regulation (LVR) module 600 that can be used to implement the LVR module 250 of FIG. 2. Those skilled in the art will understand that the LVR module 600 is just one possible way to implement the LVR module 250 of FIG. 2. When VRECT is below LVR, the LVR module 600 operates to decrease the loading current that appears at output node VOUT.

In operation, VRECT is applied to first resistive divider 602, which generates a divided-down voltage 603 based on the relative sizes of resistors R3 and R4. The divided-down voltage 603 is applied to the negative input of first error amplifier 604, whose positive input is the reference voltage VREF12, where LVR=VREF12*(1+R3/R4). Note that VREF12 can be generated by a bandgap voltage generator or other suitable circuitry for accurately generating a substantially constant voltage level. The resulting amplified error signal 605 is applied to first voltage-to-current (V2I) converter 606, which generates and applies current signal 607 to current summer 618.

The voltage at the output node VOUT is applied to second resistive divider 608, which generates a divided-down voltage 609 based on the relative sizes of resistors R5 and R6. The divided-down voltage 609 is applied to the positive input of second error amplifier 610, whose negative input is VREF12. The resulting amplified error signal 611 is applied to second V2I converter 612, which generates and applies current signal 613 to the current summer 618.

The current summer 618 also receives a mirrored current signal 617 generated by current mirror 616 based on a current signal 615 tapped at node 614.

The current summer 618 generates a sink current signal 619 corresponding to the sum of the current signals 607, 613, and 617. An I2V converter 620 adds a constant bias current IB to the sink current signal 619 and converts the resulting current signal into a voltage signal 621. A high-impedance driver 624 receives power 623 from charge pump 622 to generate a gate control signal 625 based on the voltage signal 621, where the gate control signal 625 controls a transistor 626. In one embodiment, the transistor 626 is a NFET. The impedance driver 624 has a high input impedance, during stable operations, so the magnitude of the sink current signal 619 remains equal to the constant bias current IB.

When VRECT is above LVR, the error signal 605 from the error amplifier 604 is zero, and the V2I converter 606 generates a zero-current signal 607. In that case, the only non-zero contributions to the current summer 618 are the current signals 613 and 617.

When VRECT is below LVR, the error signal 605 from the error amplifier 604 is positive, and the V2I converter 606 generates a non-zero current signal 607. In that case, all three current inputs to the current summer 618 are non-zero. As such, since the current signal 607 is now a non-zero current signal, in order to keep the sink current signal 619 constant, either the magnitude of the current signal 613 must decrease or the magnitude of the current signal 617 must decrease or both. The magnitude of the current signal 613 will decrease when the voltage signal 609 is lower, which means that the current flowing through the first resistive divider 608 is smaller. The magnitude of the current signal 617 will decrease when the current flowing through node 614 is smaller. Either way, the loading current at the output node VOUT will also be smaller. Thus, the LVR module 600 decreases the loading current when VRECT is below LVR.

Note that transistor 626 and first resistive divider 608 form an output leg of the LVR module 600.

Figure 7:
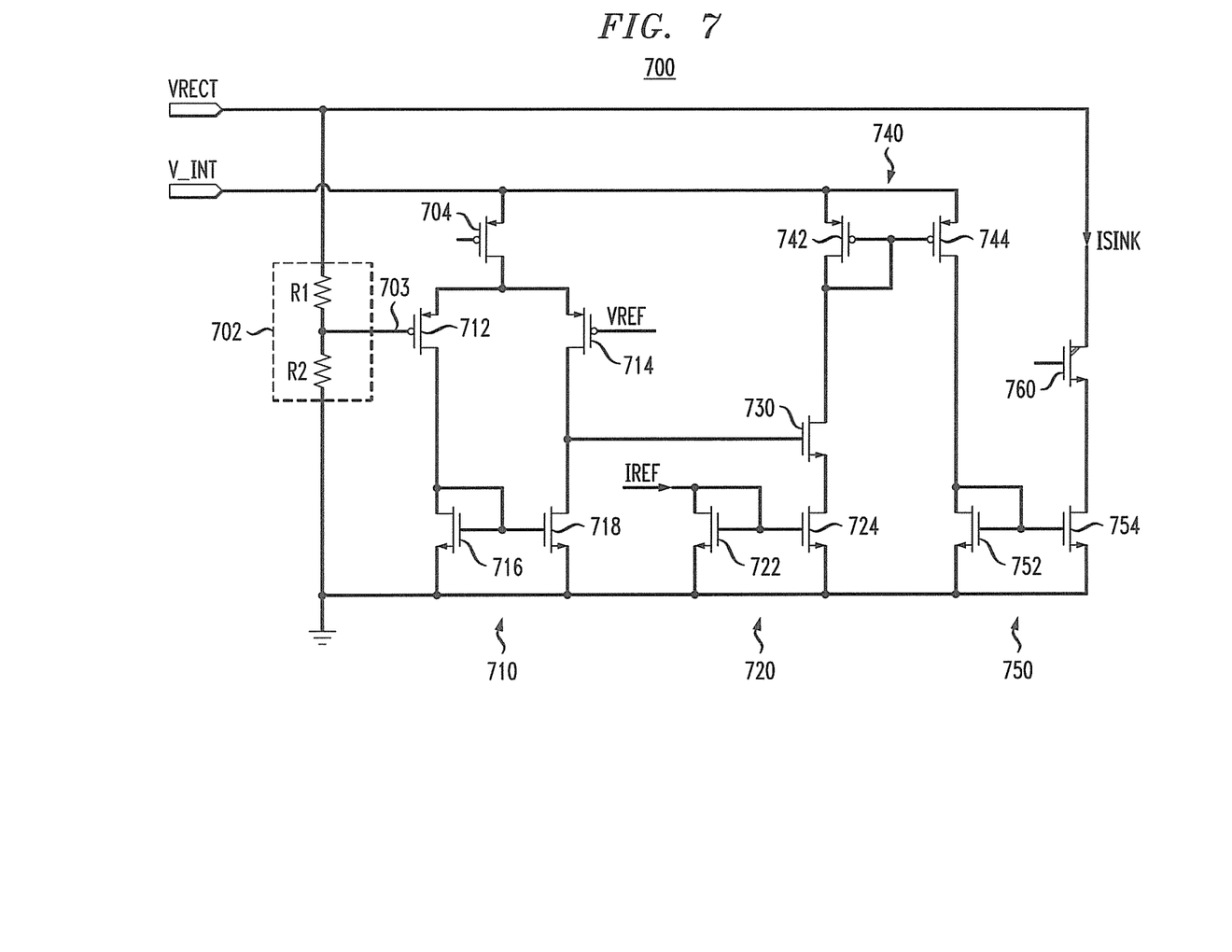
FIG. 7 is a schematic circuit diagram of a high-voltage regulation (HVR) module that can be used to implement the HVR module of FIG. 2.

FIG. 7 is a schematic circuit diagram of a high-voltage regulation (HVR) module 700 that can be used to implement the HVR module 244 of FIG. 2. Those skilled in the art will understand that the HVR module 700 is just one possible way to implement the HVR module 244 of FIG. 2. When VRECT is above HVR, the HVR module 700 operates to inhibit increases in VRECT.

Transistors 712, 714, 716, and 718 form a comparator 710. Transistors 722 and 724 form a current master 720, while transistors 742 and 744 form a first current mirror 740 and transistors 752 and 754 form a second current mirror 750 that can mirror the reference current IREF as a mirrored current through the transistor 754. Transistor 730 functions as a switch that controls, based on the output from the comparator 710, whether or not the reference current IREF gets mirrored through the transistor 754. The transistors 754 and 760 form an output leg of the HVR module 700.

In operation, VRECT is applied to resistive divider 702, which generates a divided-down voltage 703 based on the relative sizes of resistors R1 and R2. The divided-down voltage 703 is applied to the gate of PFET 712, while the reference voltage VREF is applied to the gate of PFET 714, where HVR=VREF*(1+R1/R2). Note that VREF can be generated by a bandgap voltage generator or other suitable circuitry for accurately generating a substantially constant voltage level.

When VRECT is below HVR, the gate of NFET 730 is driven low, turning off the NFET 730 and ensuring that the reference current IREF is not mirrored through NFET 754. However, when VRECT is above HVR, the gate of NFET 730 is driven high, turning on the NFET 730 and enabling the reference current IREF to be mirrored through the NFET 754, thereby drawing sink current ISINK from node VRECT and inhibiting increases in the voltage level of VRECT. The sink current ISINK from VRECT to ground is limited to IREF*K, where K is the total gain of the current mirrors 740 and 750, which can be accurately trimmed. Note that appropriate DC bias voltages are applied to the gates of PFET 704 and NFET 760 to ensure that they are always on. Thus, the HVR module 700 inhibits increases in VRECT when VRECT is above HVR.

Although the invention has been described in terms of separate regulation modules that monitor VRECT and take the discussed actions depending on the value of VRECT, the system could comprise a process that monitors VRECT and uses software (or firmware) to take the described actions. Further, although the invention has been described in the context of a wireless charging system in which the power transfer path and the communication path between the TX and RX share the same inductive interface, the invention can also be implemented in the context of wireless charging systems having separate wireless interfaces for power transfer and communication.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding terminals, nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may comprise multiple transistors coupled in parallel to get desired electrical characteristics from the combination. Further, the illustrated transistors may be composite transistors.

As used in this specification and claims, the term "channel node" refers generically to either the source or drain of a metal oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer respectively either to the source, drain, and gate of a MOSFET or to the emitter, collector, and base of a bi-polar device if an embodiment of the invention is implemented using bi-polar transistor technology. Also, the terms source, drain and gate mean the same as "source terminal", "drain terminal" and "gate terminal," respectively and may be used interchangeably.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A power receiver (RX) for a wireless charging system that includes a power transmitter (TX) that wirelessly transmits an AC power signal to the RX, the RX comprising: a rectifier configured to rectify the AC power signal to a DC power signal; and a plurality of regulation modules configured to monitor the DC power signal in a plurality of voltage regions comprising two or more different high-voltage regions and two or more different low-voltage regions, wherein each regulation module is configured to affect operations of the wireless charging system in a different way; wherein the plurality of voltage regions includes, a first region comprising voltages above an over-voltage protection (OVP) voltage level; a second region comprising voltages below the OVP voltage level and above a high-voltage regulation (HVR) voltage level; a third region comprising voltages below the HVR voltage level and above an over-voltage warning (OVW) voltage level; a fourth region comprising voltages below the OVW voltage level and above a low-voltage regulation (LVR) voltage level; a fifth region comprising voltages below the LVR voltage level and above an under-voltage lookout (UVLO) voltage level; and a sixth region comprising voltages below the UVLO voltage level.

2. The RX of claim 1, wherein the plurality of regulation modules comprises: an OVP module that monitors the DC power signal for voltages above the OVP voltage level; an HVR module that monitors the DC power signal for voltages above the HVR voltage level; an OVW module that monitors the DC power signal for voltages above the OVW voltage level; an LVR module that monitors the DC power signal for voltages below the LVR voltage level; and a UVLO module that monitors the DC power signal for voltages below the UVLO voltage level.

3. The RX of claim 2, wherein: when the OVP module determines that the DC power signal is above the OVP voltage level, the OVP module shuts down rectification by the rectifier and the RX instructs the TX to decrease a power transfer level; when the HVR module determines that the DC power signal is above the HVR voltage level, the HVR module inhibits the DC power signal from increasing and the RX instructs the TX to decrease the power transfer level; when the OVW module determines that the DC power signal is above the OVW voltage level, the RX instructs the TX to decrease the power transfer level; when the LVR module determines that the DC power signal is below the LVR voltage level, the LVR module reduces a loading current of the RX and the RX instructs the TX to increase the power transfer level; and when the UVLO module determines that the DC power signal is below the UVLO voltage level, the UVLO module causes one or more other modules in the RX to be shut down and the RX instructs the TX to increase the power transfer level.

4. The RX of claim 2, wherein the HVR module comprises: a comparator that compares an input voltage signal based on the DC power signal to a reference voltage signal based on the HVR voltage level; and a current master and one or more current mirrors configured to generate a mirrored sink current signal when the input voltage signal is above the reference voltage signal, wherein the mirrored sink current signal is applied to the DC power signal.

5. The RX of claim 2, wherein the LVR module comprises: a first error amplifier that generates a first error signal based on a difference between (i) an input voltage signal based on the DC power signal and (ii) a reference voltage signal based on the LVR voltage level; a first voltage-to-current (V2I) converter that converts the first error signal into a first current signal; a second error amplifier that generates a second error signal based on a difference between (i) the reference voltage signal and (ii) a feedback voltage signal based on a voltage at an output node of the RX; a second V2I converter that converts the second error signal into a second current signal; a current mirror that generates a third current signal based on current flowing through an output leg of the LVR module; a current summer that generates a sink current signal based on a sum of the first, second, and third current signals; a charge pump that generates a source current signal; a current-to-voltage (I2V) converter that generates a gate voltage signal based on a sum of the source current signal and the sink current signal; and a power transistor located in the output leg of the LVR module and controlled by the gate voltage signal, wherein: when the DC signal is higher than the LVR voltage level, then the first error signal is zero, the first current signal is a zero-current signal, and current in the output leg of the LVR module is at a first level; and when the DC signal is lower than the LVR voltage level, then the first error signal is positive, the first current signal is a non-zero current signal, and the current in the output leg of the LVR module is at a second level lower than the first level.

6. The RX of claim 1, wherein a communication path between the TX and RX and a power transfer path from the TX to the RX share a common inductive interface.

7. A wireless charging system, comprising: a power transmitter (TX); and a power receiver (RX), wherein the RX comprises: a rectifier configured to rectify an AC power signal received wirelessly from the TX into a DC power signal; and a plurality of regulation modules configured to monitor the DC power signal in a plurality of voltage regions comprising one or more different high-voltage regions and one or more different low-voltage regions, wherein each regulation module is configured to affect operations of the wireless charging system in a different way; wherein the plurality of voltage regions includes, a first region comprising voltages above an over-voltage protection (OVP) voltage level; a second region comprising voltages below the OVP voltage level and above a high-voltage regulation (HVR) voltage level; a third region comprising voltages below the HVR voltage level and above an over-voltage warning (OVW) voltage level; a fourth region comprising voltages below the OVW voltage level and above a low-voltage regulation (LVR) voltage level; a fifth region comprising voltages below the LVR voltage level and above an under-voltage lookout (UVLO) voltage level; and a sixth region comprising voltages below the UVLO voltage level.

8. The wireless charging system of claim 7, wherein the plurality of regulation modules comprises: an OVP module that monitors the DC power signal for voltages above the OVP voltage level; an HVR module that monitors the DC power signal for voltages above the HVR voltage level; an OVW module that monitors the DC power signal for voltages above the OVW voltage level; an LVR module that monitors the DC power signal for voltages below the LVR voltage level; and a UVLO module that monitors the DC power signal for voltages below the UVLO voltage level.

9. The wireless charging system of claim 8, wherein: when the OVP module determines that the DC power signal is above the OVP voltage level, the OVP module shuts down rectification by the rectifier and the RX instructs the TX to decrease a power level of the transmitted AC power signal; when the HVR module determines that the DC power signal is above the HVR voltage level, the HVR module inhibits the DC power signal from increasing and the RX instructs the TX to decrease the power level of the transmitted AC power signal; when the OVW module determines that the DC power signal is above the OVW voltage level, the RX instructs the TX to decrease the power level of the transmitted AC power signal; when the LVR module determines that the DC power signal is below the LVR voltage level, the LVR module reduces loading current of the RX and the RX instructs the TX to increase the power level of the transmitted AC power signal; and when the UVLO module determines that the DC power signal is below the UVLO voltage level, the UVLO module causes one or more other modules in the RX to be shut down and the RX instructs the TX to increase the power level of the transmitted AC power signal.

10. The wireless charging system of claim 8, wherein the HVR module comprises: a comparator that compares an input voltage signal based on the DC power signal to a reference voltage signal based on the HVR voltage level; and a current master and one or more current mirrors that generate a mirrored sink current signal when the input voltage signal is above the reference voltage signal, wherein the mirrored sink current signal is applied to the DC power signal.

11. The wireless charging system of claim 8, wherein the LVR module comprises: a first error amplifier that generates a first error signal based on a difference between (i) an input voltage signal based on the DC power signal and (ii) a reference voltage signal based on the LVR voltage level; a first voltage-to-current (V2I) converter that converts the first error signal into a first current signal; a second error amplifier that generates a second error signal based on a difference between (i) the reference voltage signal and (ii) a feedback voltage signal based on voltage at an output node of the RX subsystem; a second V2I converter that converts the second error signal into a second current signal; a current mirror that generates a third current signal based on current flowing through an output leg of the LVR module; a current summer that generates a sink current signal based on a sum of the first, second, and third current signals; a charge pump that generates a source current signal; a current-to-voltage (I2V) converter that generates a gate voltage signal based on a sum of the source current signal and the sink current signal; and a power transistor located in the output leg of the LVR module and controlled by the gate voltage signal, wherein: when the DC signal is higher than the LVR voltage level, then the first error signal is zero, the first current signal is a zero-current signal, and current in the output leg of the LVR module is at a first level; and when the DC signal is lower than the LVR voltage level, then the first error signal is positive, the first current signal is a non-zero current signal, and the current in the output leg of the LVR module is at a second level lower than the first level.

12. The wireless charging system of claim 7, wherein a communication path between the TX and RX and a power transfer path from the TX to the RX share a common inductive interface.

\* \* \* \* \*